(12) United States Patent
Zhao et al.

(10) Patent No.: US 11,127,591 B2
(45) Date of Patent: Sep. 21, 2021

(54) LIGHT EMITTERS ON TRANSITION METAL DICHALCOGENIDES DIRECTLY CONVERTED FROM THERMALLY AND ELECTRICALLY CONDUCTIVE SUBSTRATES AND METHOD OF MAKING THE SAME

(71) Applicants: King Abdullah University of Science and Technology, Thuwal (SA); KING ABDULAZIZ CITY FOR SCIENCE AND TECHNOLOGY, Riyadh (SA)

(72) Inventors: Chao Zhao, Thuwal (SA); Tien Khee Ng, Thuwal (SA); Lain-Jong Li, Thuwal (SA); Boon Siew Ooi, Thuwal (SA); Ahmed Y. Alyameni, Riyadh (SA); Munir M. Eldesouki, Riyadh (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 192 days.

(21) Appl. No.: 16/090,758

(22) PCT Filed: May 9, 2017

(86) PCT No.: PCT/IB2017/052708
§ 371 (c)(1),
(2) Date: Oct. 2, 2018

(87) PCT Pub. No.: WO2017/195118
PCT Pub. Date: Nov. 16, 2017

(65) Prior Publication Data
US 2020/0328079 A1     Oct. 15, 2020

Related U.S. Application Data

(60) Provisional application No. 62/334,144, filed on May 10, 2016.

(51) Int. Cl.
*H01L 29/10* (2006.01)
*H01L 21/02* (2006.01)
(Continued)

(52) U.S. Cl.
CPC .. *H01L 21/02485* (2013.01); *H01L 21/02425* (2013.01); *H01L 29/068* (2013.01);
(Continued)

(58) Field of Classification Search
CPC ......... H01L 21/02425; H01L 21/02458; H01L 21/02461; H01L 21/02463;
(Continued)

(56) References Cited

U.S. PATENT DOCUMENTS 6,323,053 B1   11/2001   Nishikawa et al.
7,629,195 B2   12/2009   Tran et al.
(Continued)

FOREIGN PATENT DOCUMENTS

JP   11224856   8/1999
JP     243253   9/1999
(Continued)

OTHER PUBLICATIONS

Yamada, et al., "Layered compound substrates for GaN growth", Journal of Crystal Growth, 1999, 332-335. (Year: 1999).*
(Continued)

*Primary Examiner* — Brook Kebede
(74) *Attorney, Agent, or Firm* — Billion & Armitage

(57) ABSTRACT

Methods of direct growth of high quality group III-V and group III-N based materials and semiconductor device structures in the form of nanowires, planar thin film, and nanowires-based devices on metal substrates are presented. The present compound semiconductor all-metal scheme greatly simplifies the fabrication process of high power light emitters overcoming limited thermal and electrical conductivity
(Continued)

of nanowires grown on silicon substrates and metal thin film in prior art. In an embodiment the methods include: (i) providing a metal substrate; (ii) forming a transition metal dichalcogenide (TMDC) layer on a surface of the metal substrate; and (iii) growing a semiconductor epilayer on the transition metal dichalcogenide layer using a semiconductor epitaxy growth system. In an embodiment, the semiconductor device structures can be compound semiconductors in contact with a layer of metal dichalcogenide, wherein the layer of metal dichalcogenide is in contact with a metal substrate.

19 Claims, 7 Drawing Sheets

(51) Int. Cl.
  *H01L 29/06* (2006.01)
  *H01L 29/267* (2006.01)
  *H01L 23/29* (2006.01)
(52) U.S. Cl.
  CPC ........ *H01L 29/0676* (2013.01); *H01L 29/267* (2013.01); *H01L 21/0254* (2013.01); *H01L 21/02603* (2013.01); *H01L 23/29* (2013.01)
(58) Field of Classification Search
  CPC ........... H01L 21/02485; H01L 29/0676; H01L 29/068; H01L 29/267
  USPC ......................................................... 257/43
  See application file for complete search history.

(56) References Cited

U.S. PATENT DOCUMENTS

| | | | | |
|---|---|---|---|---|
| 2014/0027775 | A1* | 1/2014 | Quick | H01L 21/02568 257/53 |
| 2014/0070167 | A1 | 3/2014 | Zebarjadi et al. | |
| 2014/0220764 | A1 | 8/2014 | Bayram et al. | |
| 2015/0200256 | A1 | 7/2015 | Hanser et al. | |
| 2016/0013277 | A1* | 1/2016 | Ho | H01L 21/0242 257/29 |
| 2017/0062213 | A1* | 3/2017 | Patolsky | H01L 21/3065 |
| 2017/0088945 | A1* | 3/2017 | Chueh | C23C 14/5826 |

FOREIGN PATENT DOCUMENTS

| | | | |
|---|---|---|---|
| WO | 2007037762 | 4/2007 | |
| WO | 2012067687 | 5/2012 | |
| WO | 2012106814 | 8/2012 | |
| WO | 2014198370 | 12/2014 | |
| WO | WO-2015130189 A1 * | 9/2015 | ........... C03C 17/225 |

OTHER PUBLICATIONS

Arafin, et al., "Review of recent progress of III-nitride nanowire lasers", Journal of Nanophonics, 2013, 1-28.
Carter Jr., et al., "Progress in SiC: from material growth to commercial device development", Materials Science and Engineering, 1999, 1-8.
Choi, et al., "Nearly single-crystalline GaN light-emitting diodes on amorphous glass substrates", Nature Photonics, Dec. 2011, 763-769.
Chu-Li, et al., "Reduction of Efficiency Droop in InGaN Light-Emitting Diode Grown on Self-Separated Freestanding GaN Substrates", IEEE Photonics Technology Letters, vol. 21, Jun. 15, 2011, 798-800.
Edwards, et al., "InGaN/GaN Quantum Well Microcavities Formed by Laser Lift-Off and Plasma Etching", phys. stat. sol., 2001, 91-94.
Feezell, et al., "Semipolar 2021 InGaN/GaN Light-Emitting Diodes for High-Efficiency Solid-State Lighting", Journal of Display Technology vol. 9, Apr. 2013, 190-198.
Guo, et al., "Catalyst-Free InGaN/GaN Nanowire Light Emitting Diodes Grown on (001) Silicon by Molecular Beam Epitaxy", Nano Letters, 2010, 3355-3359.
Hestroffer, et al., "In situ study of self-assembled GaN nanowires nucleation on Si(111) by plasma-assisted molecular beam epitaxy", Applied Physics Letters, 2012, 1-6.
Hsin-Ying, et al., "Light Output Enhancement of GaN-Based Roughened LEDs Using Bias-Assisted Photoelectrochemical Etching Method", 2008, 1-3.
Jeehwan, "Principle of direct van der Waals epitaxy of single-crystalline films on epitaxial graphene", nature communications, 2014, 1-7.
Jen-Hau, et al., "Thermal management of vertical gallium nitride Nanowire arrays: cooling design and tip temperature Measurement", 2010, 468-471.
Jianpeng, et al., "High mobility AlGaN/GaN heterostructures grown on Si substrates using a large lattice-mismatch induced stress control technology", Applied Physics Letters, 2015, 1-5.
Krost, et al., "GaN-based optoelectronics on silicon substrates", Materials Science and Engineering B93, 2002, 77-84.
Matthews, et al., "Heat flow in InAs/InP heterostructure nanowires", Lund University, 2012, 1-9.
Mehmet, et al., "Thermal Management of LEDs: Package to System", Jul. 4, 2014, 64-75.
Sarwar, et al., "Semiconductor Nanowire Light Emitting Diodes Grown on Metal: A Direction towards Large Scale Fabrication of Nanowire Devices", 2015, 1-18.
Schuster, et al., "Position-Controlled Growth of GaN Nanowires and Nanotubes on Diamond by Molecular Beam Epitaxy", Nano Letters, Nov. 19, 2014, 1-7.
Speck, et al., "The role of threading dislocations in the physical properties of GaN and its alloys", Physica, 1999, 24-32.
Tan, et al., "Performance enhancement of InGaN light-emitting diodes by laser lift-off and transfer from sapphire to copper substrate", 2757-2759, Apr. 12, 2004.
Tsai, et al., "The effect of free-standing GaN substrate on carrier localization in ultraviolet InGaN light-emitting diodes" Nanoscale Research Letters, 2014, 1-7.
Wolz, et al., "Epitaxial Growth of GaN Nanowires with High Structural Perfection on a Metallic TiN Film", Nano Letters, 2015, 3743-3747.
Yamada, et al., "Layered compound substrates for GaN growth", Journal of Crystal Growth, 1999, 332-335.
Yamada, et al., "Molecular beam epitaxy of GaN on a substrate of MoS2 layered compound", Applied Physics A Materials Science & Processing, 1999, 89-92.
Yan, et al., "AlGaN-based deep-ultraviolet light-emitting diodes grown on High-quality AlN template using MOVPE", Journal of Crystal Growth 414, 2015, 254-257.
Zetian, et al., "Molecular beam epitaxial growth and characterization of InGaN/GaN dot-in-a-wire nanoscale heterostructures: toward ultrahigh efficiency phosphor-free white light emitting diodes", Invited Paper, 2013, 1-8.
Ellmer, "Preparation routes based on magnetron sputtering for tungsten disulfide (WS2) films for thin-film solar cells", Physica Status Solidi. B, Basic Resea, Akademie Verlag, Berlin, DE, vol. 245, No. 9, Aug. 11, 2008, pp. 1745-1760.
Notification of Transmittal of the International Search Report and the Written Opinion of the International Searching Authority for PCT/IB2017/052708.

* cited by examiner

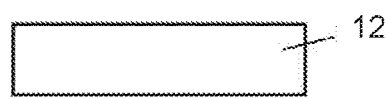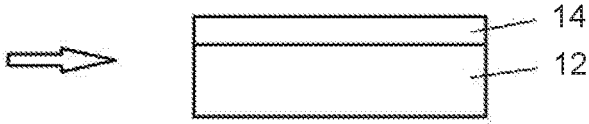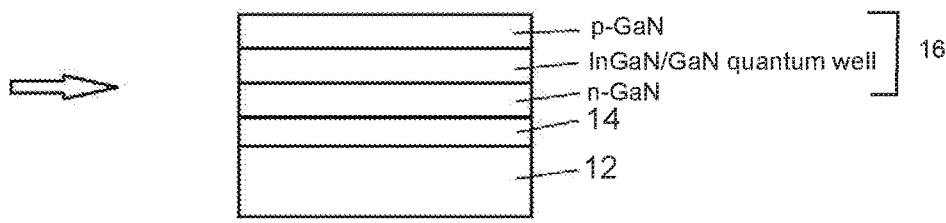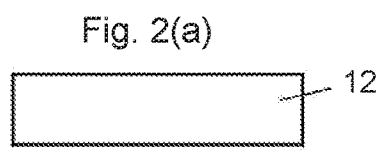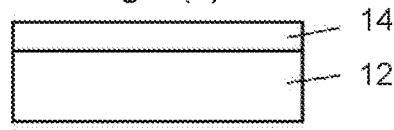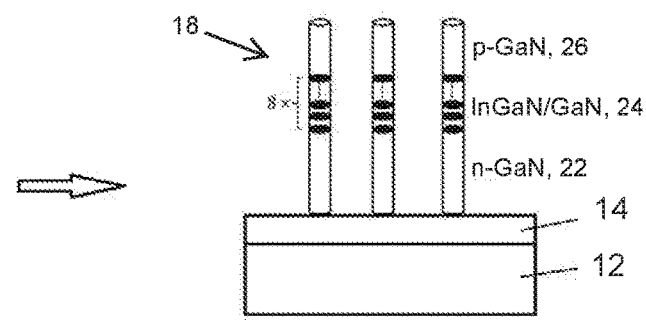

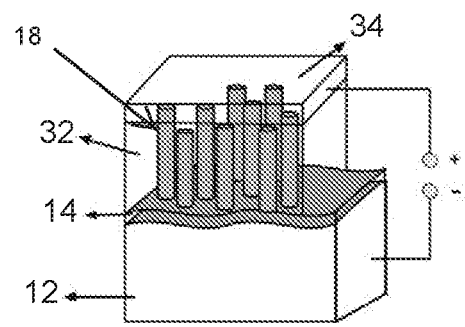
Fig. 3
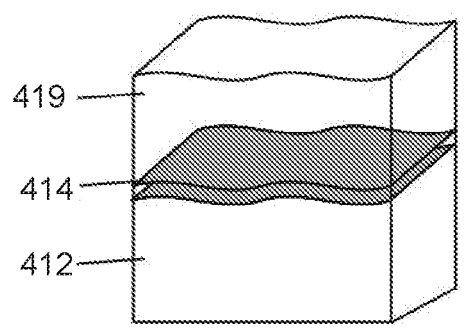
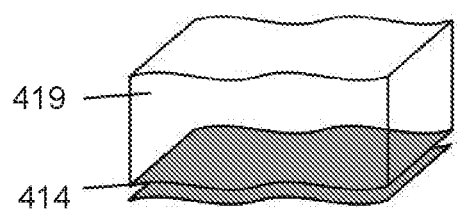
Fig. 4(a)
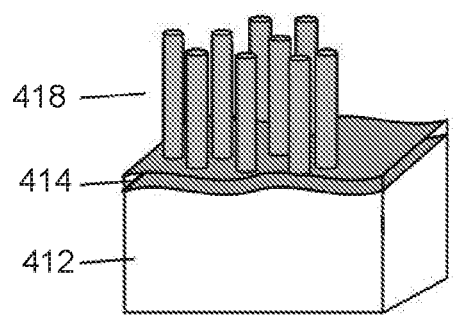
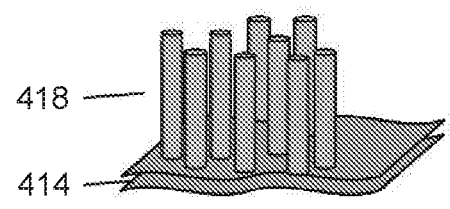
Fig. 4(b)

Fig. 5(a)
Fig. 5(b)
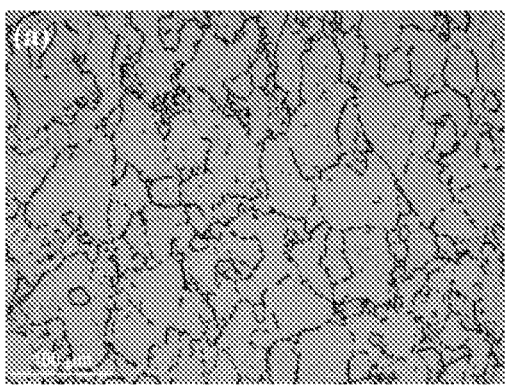 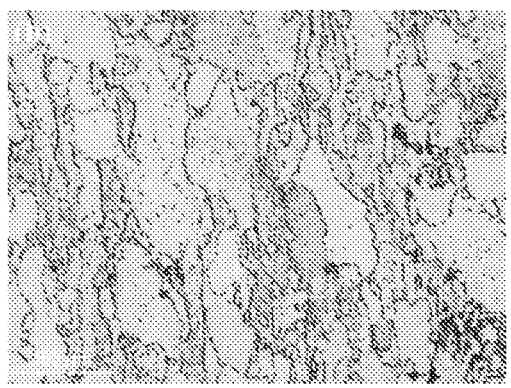
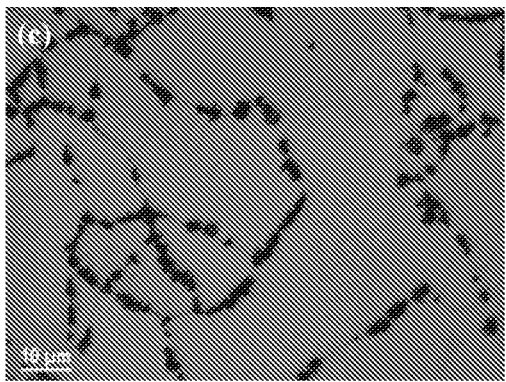 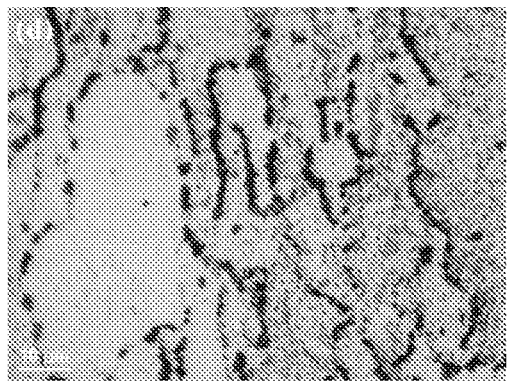
Fig. 5(c)
Fig. 5(d)

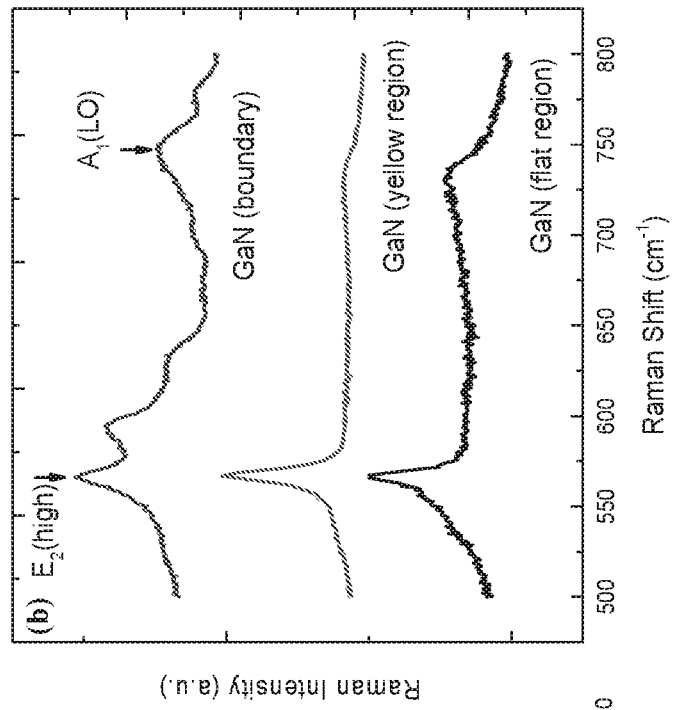
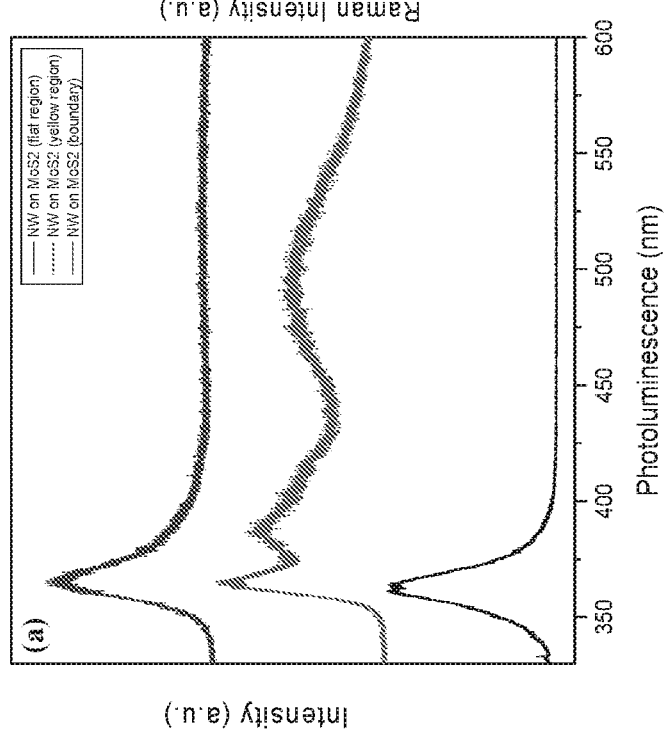
Fig. 9(a)
Fig. 9(b)

LIGHT EMITTERS ON TRANSITION METAL DICHALCOGENIDES DIRECTLY CONVERTED FROM THERMALLY AND ELECTRICALLY CONDUCTIVE SUBSTRATES AND METHOD OF MAKING THE SAME

CROSS-REFERENCE TO RELATED APPLICATION

This application claims the benefit of and priority to U.S. Provisional Application Ser. No. 62/334,144, having the title "LIGHT EMITTERS ON TRANSITION METAL DICHALCOGENIDES DIRECTLY CONVERTED FROM THERMALLY AND ELECTRICALLY CONDUCTIVE SUBSTRATES AND METHOD OF MAKING THE SAME," filed on 10 May 2016, the disclosure of which is incorporated herein in by reference in its entirety.

TECHNICAL FIELD

The present disclosure generally relates to nanowires, thin films and related devices, and methods of making the same.

BACKGROUND

Group III-nitride vertically aligned nanowires and nanowire-devices grown on silicon are compound semiconductors that have recently been developed for solid-state lighting. They have shown various advantages over their counterparts, such as GaN on sapphire:[1] GaN bulk substrates,[2] SiC,[3] and GaN-on-silicon substrates.[4] High efficiency phosphor-free white nanowire light-emitting diodes (NW-LEDs) on silicon exhibited nearly zero efficiency droop.[5] These InGaN/GaN nanowires and white-emitting LEDs showed negligible quantum confined Stark effect (QCSE), which is desirable for improved quantum efficiencies.[6]

Despite the high-quality nanowires and superior devices grown on single-crystalline silicon substrates, there are issues that remain to be addressed relating to growth of nanowires and thin films, device operation, and facile transfer of nanowires and/or thin films.

Existing group III-N nanowires light emitters are normally grown on silicon substrates. They can suffer from the formation of an amorphous silicon nitride layer at the interface of nanowires and substrates due to strong reactivity of N with Si.[7,8] An issue is related to the formation of an amorphous SiNx layer where active nitrogen radicals impinge upon the silicon surface,[9] which hinders carriers flow and heat dissipation in operation. The small diameter of the nanowires can cause high junction temperature of NW-LEDs and lasers associated with the high injection current density, as compared to that in conventional planar devices.[10] Additionally, the electrons and phonons that carry the heat are confined to one-dimensional transport along the nanowire.[11,12]

The thermal management of nanowire devices thus can be important to avoiding "thermal droop" because of the high heat flux and carrier de-population from the Qdisks, leading to efficiency roll-over.[3] The issue is further aggravated by the fact that, in practical solid-state lighting applications, the operating temperature can be as high as 120° C.[4] Furthermore, significant visible light absorption reduces quantum efficiencies in LEDs on silicon.

GaN nanostructures and microstructures have been demonstrated on diamond and amorphous glass,[15,16] which can address the thermal conductivity and/or absorption issues respectively. This technique, however, does not simultaneously resolve the absorption, thermal conductivity, and electrical conductivity issues for high-power device operation at elevated temperatures.

Existing gallium nitride films have also been grown on sapphire, SiC and GaN bulk substrate by using thick nucleation and/or an inserting layer among other techniques. These techniques suffer from high dislocation density of the film or high cost of the substrates, preventing widespread adoption or use.[17-21] Existing nanowires have also been grown on sputtered Ti or Mo thin film, but still suffer from the poor thermal and electrical conductivity of the Si or sapphire substrate.[22-24]

Existing gallium nitride films have also been grown on molybdenum sulphide and graphene substrates, on $WS_2$, $MoS_2$ flakes and CVD $MoS_2$, and on other mechanically-exfoliated transition metal dichalcogenides (TMDCs) like $WSe_2$, $MoSe_2$, $ReS_2$ and $ReSe_2$. These methods and techniques still suffer from poor thermal and electrical conductivity of the substrate.[25-28]

Facile transfer of nanowires and/or thin films across substrates is an important step for device fabrication. Existing techniques for transferring nanowire LEDs or planar LEDs onto conductive substrates require complex fabrication processing steps, such as transfer of LED epitaxy onto copper- or molybdenum-based substrates or flexible substrates based on photo-electrochemical etching (PEC) lift-off, laser lift-off (LLO) or wafer bonding.[29-36] Simpler methods of transfer are desired.

Accordingly, there is a need to address the aforementioned deficiencies and inadequacies.

SUMMARY

In an embodiment, we provide a method of growing elemental or compound semiconductors on metal substrates. They address the aforementioned deficiencies and inadequacies. The metal substrates can be bulk metal substrates. In one or more aspects, high quality nitride materials grown on low cost and scalable metallic substrates are provided. They can be, highly attractive, for example, for high power and high brightness optical devices due to their excellent thermal, and electrical conductivity for addressing thermal and efficiency droop in light-emitters.

In an embodiment, methods of direct growth of high quality group III-V (such as GaAs, InP, GaSb and their related ternary and quaternary compounds, such as AlGaAs, InGaP, InGaAs, InGaAsP, etc.) group III-N (such as GaN, AlN, InN, InGaN, AlGaN, and their related binary, ternary and quaternary compounds) based materials in the form of nanowires, planar thin film, nanowires-based and thin film-based devices on metal substrates are presented. The present compound semiconductor all-metal scheme greatly simplifies the fabrication process of high power light emitters especially high power LEDs and laser diodes (LDs), and high power electronic devices (such as high mobility transistors (HEMTs), etc.), overcoming limited thermal and electrical conductivity of nanowires grown on silicon substrates and metal thin film in prior art.

As compared to the existing micron-thick (Al,Ga)N low temperature buffer, our methods of growth of nitride semiconductors mitigates crystal structure, lattice constant mismatch. Unlike transfer of graphene or dichalcogenides, the nitride on monolayer thickness, lattice-matched dichalcogenides buffer layer directly converted from metal substrate simplifies the fabrication process of high power light emitters especially high power LEDs and laser diodes (LDs), and high power electronic devices (such as high mobility transistors (HEMTs), etc.), overcoming limited electrical and thermal conductivities of nitride grown on sapphire, silicon substrates and metal thin film in prior art.

In various embodiments, methods of growing an elemental or compound semiconductor on a metal substrate are provided. The methods can comprise the steps of: (i) providing the metal substrate; (ii) forming a transition metal dichalcogenide (TMDC) layer on a surface of the metal substrate; and (iii) growing a semiconductor epilayer on the transition metal dichalcogenide layer using a semiconductor epitaxy growth system.

In any one or more aspects of the methods, the semiconductor epilayer can be a planar thin film or nanowires or both. The compound semiconductors can include SiC or ZnO. The compound semiconductors can be group III-N compound semiconductors. The compound semiconductors can be selected from the group consisting of: GaN, AlN, InN, InGaN, AlGaN, binary relatives thereof, ternary relatives thereof, and quaternary relatives thereof. The compound semiconductor can be selected from a group III-V compound semiconductor, preferably GaAs, InP, GaSb and their related ternary and quaternary compounds, such as AlGaAs, InGaP, InGaAs, InGaAsP. Multiple semiconductor layers can be present that form p-i-n, n-i-p, quantum well/barrier, heterostructures, or double heterostructures. The metal substrate can be a thermally and/or electrically conductive substrate. The metal substrate can be a single crystal metal or a polycrystalline metal substrate. The metal substrate can be a bulk metal substrate or a metal foil. The metal substrate can be selected from the group consisting of Mo, Re, Ti, W, and combinations thereof. The transition metal dichalcogenide layer can contain a metal dichalcogenide of the formula $ME_2$, wherein M is a transition metal, and E is a chalcogen. The transition metal dichalcogenide layer can be selected from the group consisting of: $WS_2$, $MoS_2$, $WSe_2$, $MoSe_2$, $ReS_2$, $ReSe_2$, and combinations thereof. The dichalcogenide layer can be a sacrificial layer. The dichalcogenide layer can be deposited on the surface of the metal substrate using a thin film deposition technique. The thin film deposition technique can be chemical vapor deposition (CVD), atomic layer deposition (ALD), a sputtering coating technique, pulsed laser deposition (PLD), thermal evaporation, or an e-beam evaporation technique, etc. The semiconductor epitaxy growth technique can be a molecular beam epitaxy (MBE) or a metal-organic vapor pressure epitaxy (MOVPE) growth technique. The elemental or compound semiconductor can be an all-metal structure. The elemental semiconductor can include a silicon or germanium, and/or Si—Ge compound.

In an embodiment, a semiconductor device structure is provided. The semiconductor device structure can be formed from any one or more aspects of the aforementioned methods. In any one or more aspects, the structure can be a compound semiconductor in contact with a layer of metal dichalcogenide, wherein the layer of metal dichalcogenide is in contact with a metal substrate. The compound semiconductor can be a nanowires or a planar thin film device or both. The compound semiconductor can include SiC or ZnO. The compound semiconductor can be a group III-N compound semiconductor. The compound semiconductor can be selected from the group consisting of: GaN, AlN, InN, InGaN, AlGaN, binary relatives thereof, ternary relatives thereof, and quaternary relatives thereof. Multiple semiconductor layers can be present that form p-i-n, n-i-p, quantum well/barrier, heterostructures, or double heterostructures. The metal substrate can be any thermally and electrically conductive substrate. The metal substrate can be a single crystal metal or polycrystalline metal. The metal substrate can be a bulk metal substrate or a metal foil. The metal substrate can be selected from the group consisting of: Mo, Re, Ti, W, and combinations thereof. The metal dichalcogenide layer can be a transition metal dichalcogenide (TMDC) layer. The metal dichalcogenide layer can contain a metal dichalcogenide of the formula $ME_2$, wherein M is a transition metal, and E is a chalcogen. The transition metal dichalcogenide layer can be selected from the group consisting of: $WS_2$, $MoS_2$, $WSe_2$, $MoSe_2$, $ReS_2$, $ReSe_2$, and combinations thereof. The structure can be an optoelectronic or photonic device, and/or transistor or electronic device, or bulk semiconductor layer. The structure can be selected from the group consisting of: light emitting diodes (LEDs), laser diodes (LDs), photodiodes, optical modulators, semiconductor optical amplifiers, optical waveguides, photovoltaic or solar cell structures. The structure can be an electronics device selected from the group consisting of: HEMTs, HBTs, and FETs. The structure can further comprise a dielectric material in contact with the compound semiconductor. The dielectric material can be, for example, parylene. The structure can further comprise a layer of ITO in contact with the compound semiconductor or the electric material. The light emission and absorption characteristics of the structure can be achieved by adjusting the material composition of the compound semiconductor.

In an embodiment, a method of transferring nanostructures is provided. The method can comprise the steps of: providing the aforementioned structure in any one or more of its aspects; removing the dichalcogenide layer by dry etching or by mechanical exfoliation; and transferring the nanostructures to another substrate.

The present methods allow facile transfer of light-emitting epitaxy onto foreign substrates, using a sacrificial transition metal dichalcogenides layer formed directly on the substrate surface, without resorting to laser lift-off (LLO) and photoelectrochemical etching (PEC). Hence the method is versatile for direct formation of either discrete component or transfer of light-emitting membrane onto foreign substrates, either rigid or flexible, including but not limited to metal, glass, and plastic, forming a low profile light emitter based on nitride membrane.

The semiconductor nanowires described here within can support a variety of devices including, but not limited to, very high power solid-state light sources such as LEDs and LDs, high resolution flat panel display devices, flexible devices, photovoltaics, devices for wave splitting and photocatalysis, and for visible light communication, as well as power electronic devices HEMT, HBT, and FET devices for ac-dc conversion and inversion. In addition, semiconductor nanowires on high conductivity metallic substrate can also increase the device lifetime of photonics and electronics devices. In an aspect, we provide improved performance NW-LEDs and lasers demonstrating emitting at green, red and longer wavelength using InGaN/GaN Qdisks in nanowires on silicon.[7-10]

Other systems, methods, features, and advantages of the present methods and devices will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1(a)-(c) depict a typical process for producing group III-N planar thin film devices.

FIGS. 2(a)-(c) depict a typical process for producing group III-N nanowire devices.

FIG. 3 depicts a typical structure according to the present disclosure.

FIGS. 4(a)-(b) demonstrate straight forward dry etching or mechanical exfoliation of a transition metal dichalcogenides layer, for example $MoS_2$, according to the present disclosure.

FIGS. 5(a)-(d) are optical microscope images for $MoS_2$; FIGS. 5(a) and 5(c) at 700° C., which is typical GaN growth temperature in MBE, and FIGS. 5(b) and 5(d) after growth at 700° C. with Ga flux of 2.5 $e^{-8}$ Torr.

FIG. 9(a) shows PL and FIG. 9(b) shows Raman results for GaN grown on $MoS_2$/Mo.

DETAILED DESCRIPTION

Figure 6:
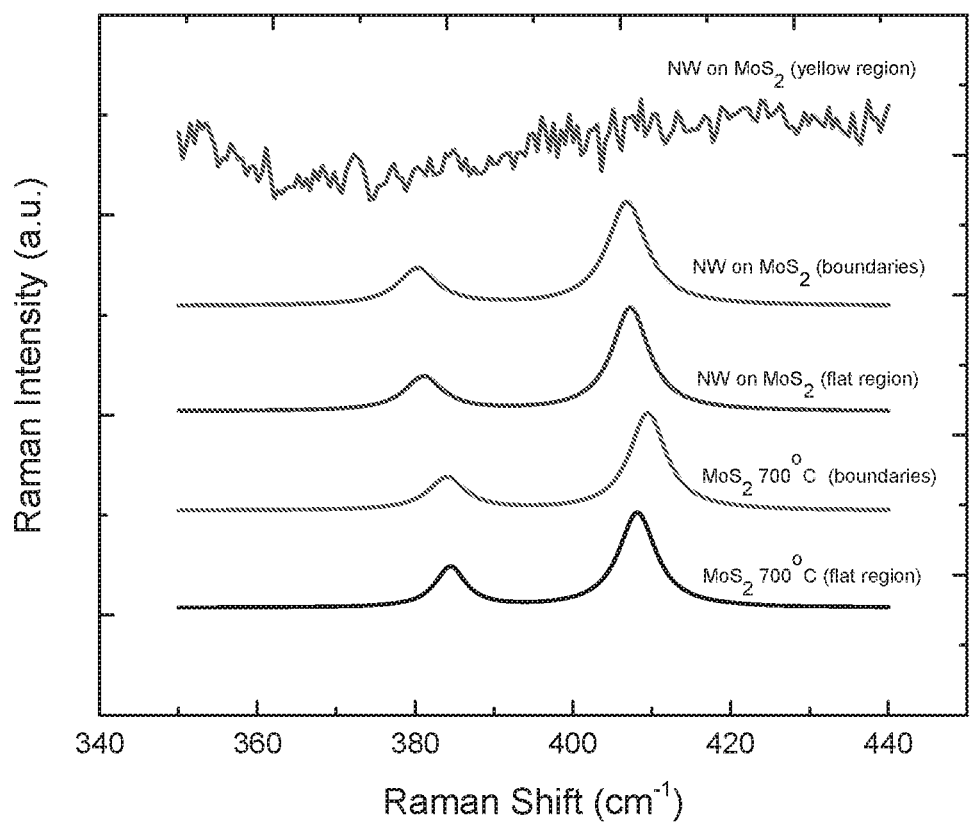
FIG. 6 depicts Raman spectra of $MoS_2$ for a sample before and after MBE growth.

Described below are various embodiments of the present light emitters and methods making of the same. Although particular embodiments are described, those embodiments are mere exemplary implementations of the system and method. One skilled in the art will recognize other embodiments are possible. All such embodiments are intended to fall within the scope of this disclosure. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic inorganic chemistry, analytical chemistry, and the like, which are within the skill of the art. Such techniques are explained fully in the literature.

It is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Description

The present disclosure is directed to nitride materials grown on inexpensive and scalable substrates. In one or more aspects, the nitride materials are high quality materials. By high quality, we mean having a low defect density. Nitride materials on inexpensive and highly scalable substrates, especially metal substrates, are highly attractive for high power and high efficiency devices due to excellent thermal and electrical conductivity properties. Nitride materials are traditionally grown on sapphire, but this arrangement suffers from high dislocation density from the material grown on the substrates because of lattice and thermal mismatch between the nitride materials and the substrate. Moreover, because of the low thermal conductivity of sapphire, it is necessary to transfer the device to a heat sink using wafer bonding or laser lift-off.

Layered transition metal dichalcogenides, such as $MoS_2$ and $WSe_2$, are almost lattice-matched to nitrides and are good materials for a buffer layer for III-nitride growth. Methods of growth of high quality group III-N (such as GaN, InGaN, AlGaN, and their related compounds) based materials in the form of nanowires, planar thin film and semiconductor devices directly on metal substrates, including the buffer layer, are described herein. As compared to the existing micron-thick (Al,Ga)N low temperature buffer, the present methods of growth of nitride semiconductors mitigates crystal structure and lattice constant mismatch. Unlike transfer of graphene or dichalcogenides, the nitride on a monolayer thickness, lattice-matched, dichalcogenides buffer layer directly converted from a metal substrate greatly simplifies the fabrication process of high power light emitters. Nitride growth on a dichalcogenide layer as above overcomes limited electrical and thermal conductivities of nitride grown on sapphire, silicon substrates, and metal thin film in the prior art.

The as-disclosed nitride-on-metal structure supports a variety of exemplary devices (including but not limited to): high resolution flat panel display devices; photovoltaics; flexible devices; high power solid-state light sources such as LEDs and LDs; devices for water splitting and visible light communication; power electronic devices, such as HEMT, HBT, and FET devices for ac-dc conversion and inversion. In addition, nitride material on high conductivity metal substrates will also increase the device lifetime of electronics and photonics devices. These devices can additionally be highly scalable.

In various embodiments a method of growing elemental or compound semiconductors on metal substrates is provided, herein. A general process flow for growing planar thin film and nanowires or for making nanowires devices of the present disclosure is depicted in FIGS. 1(a)-1(c) and FIGS. 2(a)-2(c), respectively. Beginning with FIG. 1(a) in the upper left portion and progressing clock-wise around the figure, a metal substrate 12 is provided. The substrate 12 can be any thermally and electrically conductive material. The metal substrate can be a bulk metal material, thin film material, or metal foil. In any one or more aspects, the "bulk metal" can be a metal with arbitrary thickness. The metal substrate can be a single crystal or polycrystalline metal. Suitable materials for the substrate include molybdenum, rhenium, titanium, tungsten, steel and combinations thereof.

Next, as depicted in FIG. 1(b), a buffer layer 14 is added onto a surface of the substrate 12. For example, the buffer layer 14 can be added by deposition by using a thin film deposition technique, such as electron beam being evaporation. Other methods for adding the buffer layer 14 onto the surface of the substrate 12 can be used, such as chemical vapor deposition (CUD), atomic layer deposition (ALD) pulsed laser deposition (PLD), thermal evaporation and/or a sputtering coating technique.

The buffer layer 14 can be comprised of a metal transition metal dichalcogenide (TMDC). Examples of TMDCs that can be used for the buffer layer 14 added onto the surface of the substrate 12 include $WS_2$, $MoS_2$, $WSe_2$, $MoSe_2$, and $ReSe_2$, and combinations thereof. In various aspects, the buffer layer 14 can have an arbitrary thickness. For example, the buffer layer 14 can have a thickness of 50 nm up to 1 μm, 50 nm to 900 nm, 50 nm to 800 nm, 50 nm to 700 nm, 50 nm to 600 nm, 50 nm to 500 nm, 100 nm to 900 nm, 100 nm to 800 nm, 100 nm to 700 nm, 100 nm to 600 nm, 100 nm to 500 nm, 200 nm to 900 nm, 200 nm to 800 nm, 200 nm to 700 nm, 200 nm to 600 nm, or 200 nm to 500 nm.

A planar thin film 16 can then be grown, for example, directly on the buffer layer 14. The planar thin film can be grown using a semiconductor epitaxy growth system. The epitaxy growth system can be a molecular beam epitaxy (MBE) system or a metal-organic vapor pressure epitaxy (MOVPE) system. For example, the metal substrate 12 including the buffer layer 14 can be loaded in to an epitaxy chamber which can used for growing the planar thin film 16. A Group III-N material can be provided to the chamber for growing the planar thin film. Suitable examples of Group III-N materials include GaN, AlN, InN, InGaN, AlGaN, and their related binary, ternary and quaternary compounds. A Group III-V material can also be introduced into the chamber for growing the nanowires and forming nanowires structures. Suitable examples of Group III-V materials include GaAs, InP, GaSb and their related ternary and quaternary compounds (such as AlGaAs, InGaP, InGaAs, InGaAsP, etc.).

In an embodiment, as depicted in FIG. 1(c), the planar thin film can be formed of a layer of an n-GaN in contact with the buffer layer 14, one or more alternate layers of InGaN/GaN on the side of the n-GaN layer opposite that of the buffer layer 14 to form a quantum well, and a final layer of p-GaN on top of the quantum well.

In another embodiment, as depicted in FIGS. 2(a)-(c), instead of growing a planar thin film on the buffer layer 14 nanowires 18 can be grown directly on the buffer layer 14. The nanowires 18 can be grown using a semiconductor epitaxy growth system. The epitaxy growth system can be a molecular beam epitaxy (MBE) system or a metal-organic vapor pressure epitaxy (MOVPE) system. For example, the metal substrate 12 including the buffer layer 14 can be loaded in to an epitaxy chamber which can used for growing the nanowires 18. A Group III-N material can be provided to the chamber for growing the nanowires. Suitable examples of Group III-N materials include GaN, AlN, InN, InGaN, AlGaN, and their related binary, ternary and quaternary compounds. A Group III-V material can also be introduced into the chamber for growing the nanowires and forming nanowires structures. Suitable examples of Group III-V materials include GaAs, InP, GaSb and their related ternary and quaternary compounds (such as AlGaAs, InGaP, InGaAs, InGaAsP, etc.).

In an embodiment, as depicted in FIG. 2(c), the nanowires can be formed of a layer 22 of an n-GaN in contact with the buffer layer 14, one or more alternate layers of InGaN/GaN on the side of the GaN layer 22 opposite that of the buffer layer 14, and a final layer 26 of p-GaN on top of the layer of InGaN/GaN 24. The particular embodiment of FIG. 2(c) depicts eight alternating layers of InGaN/GaN for layer 24. One skilled in the art, however, will recognize that more than eight or less than eight such layers can be provided, as needed.

An example of nanowires and a nanowires structure formed by the process of FIGS. 2(a)-2(c) is depicted in FIG. 3, wherein molybdenum is used as the substrate 12, such as (for example, polycrystalline molybdenum) and a transition metal dichalcogenide (TMDC), such as $MOS_2$, is added as the buffer layer 14. Nanowires, for example, GaN nanowires 18 are grown on the TMDC buffer layer 14 resulting in formation of buffer layer 14 between the nanowires 18 and the substrate 12.

If desired, the nanowires can be encased in a material designed to serve as a moisture and/or dielectric barrier 32, such as parylene. Parylene is the trade name for a variety of chemical vapor deposited poly(p-xylylene) polymers used as moisture and dielectric barriers. Among them, Parylene C is popular due to its combination of barrier properties, cost, and other processing advantages. The parylene can be deposited, such as by chemical vapor deposition, onto the nanowires 18. A layer 34 of indium tin oxide (ITO) can be added on top of the structure. ITO has advantages due to its electrical conductivity and optical transparency. ITO can serve as a contact base while the metal substrate can serve as the base for an opposite contact. As can be seen, an all-metal nanowires device or structure can thus be formed by direct growth of a Group III-N and/or Group III-V material directly onto the metal substrate/buffer layer (such as Mo/MoS$_2$) base.

The current methods allow facile transfer of light-emitting epitaxy, such as in the form of a thin film 419 or nanowires 418, onto foreign substrates, as shown in FIGS. 4(a)-4(b) respectively, using a sacrificial transition metal dichalcogenides layer 414 formed directly on the substrate surface 412, without resorting to LLO and PEC. The dichalcogenide can be dry-etched or mechanically exfoliated easily. Hence the methods are versatile for direct formation of either discrete component or transfer of light-emitting membrane onto foreign substrates, either rigid or flexible, including but not limited to metal, glass, and plastic, forming an extreme low profile light emitter based on nitride membrane.

EXAMPLES

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

A MoS$_2$/Mo substrate was heated to 700° C., which is a typical GaN growth temperature in MBE, FIGS. 5(a) and 5(c) show the MoS2 layer with grain boundary. MoS$_2$ is stable at this typical GaN growth temperature. Thus showing it is a suitable buffer layer. The plasma source was operated at 400 W using a constant N$_2$ flow rate of 1 standard cubic centimeter per minute (sccm). The GaN nanowires were grown at 700° C. with Ga flux of 2.5 e$^{-8}$ Torr. As shown by the optical microscope images, FIGS. 5(b) and 5(d), the grain boundary still existed, with some "yellow region" appearing.

FIG. 6 shows Raman spectra of the sample before and after MBE growth. The peaks at 382 and 407 cm$^{-1}$ are features of MoS$_2$. Before growth, MoS$_2$ existed at both the flat area and the grain boundary. However, after growth, MoS$_2$ feature was not observed in the "yellow region", probably due to the decomposition of MoS$_2$.

Figure 7:
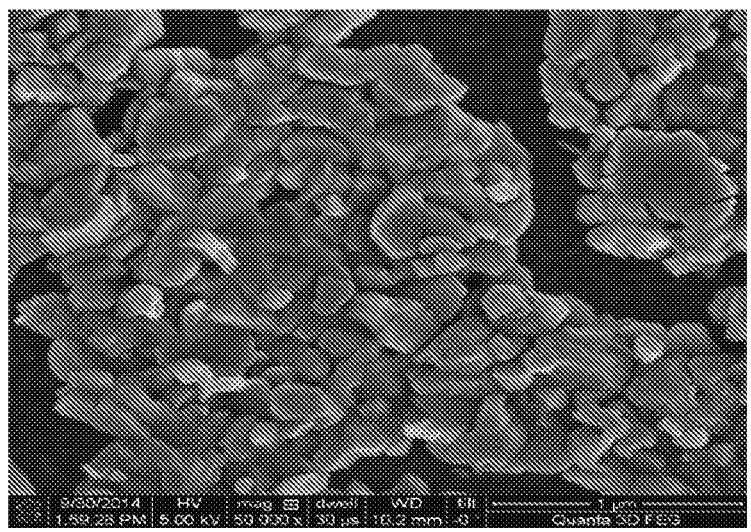
FIG. 7 is an SEM image for GaN grown on bare Mo.
Figure 8B:
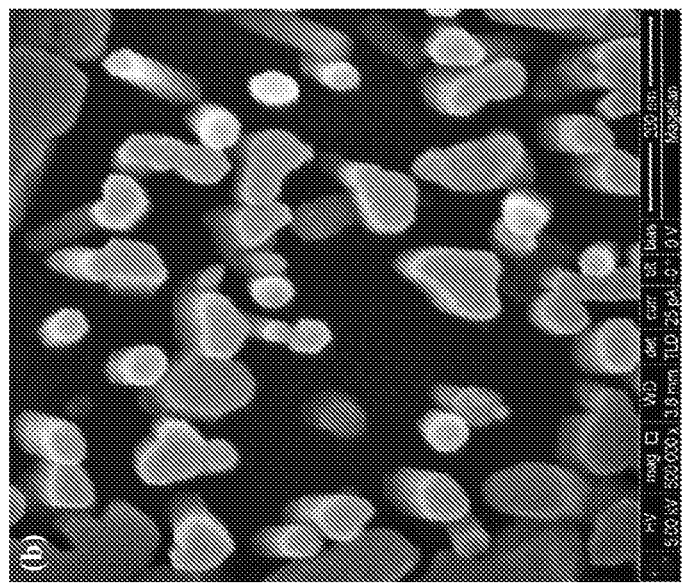
FIGS. 8(a)-(b) are SEM images for GaN grown on $MoS_2$/Mo.
Figure 8A:
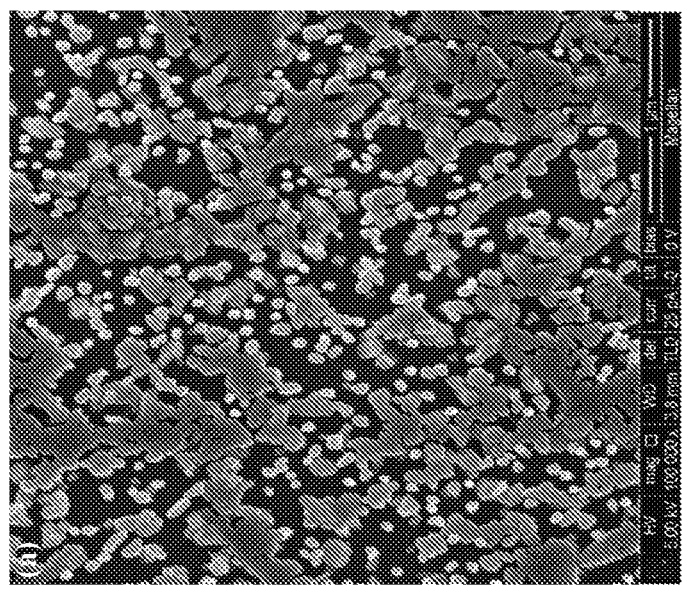

Without MoS$_2$ layer, formation of GaN nanowires was not observable on the surface of Mo substrates, as shown in FIG. 7. With MoS$_2$, most of the area showed coalescence structures (see FIGS. 8(a)-(b)). Nanowires with hexagonal shape can also be found in between, thus confirming use of MoS$_2$ as a buffer layer.

The GaN nanowires on MoS$_2$/Mo were further characterized by micro-photoluminescence (µPL) and Raman spectroscopy. The GaN emission at 365 nm was observed for different areas as shown in FIG. 9(a). However the GaN at the "yellow region" showed defect states at around 500 nm probably due to the decomposition of MoS$_2$, thus degrading the quality of the GaN grown. FIG. 9(b) shows the Raman spectra of the GaN at different areas measured in the back scattering configuration. E$_2$ high-frequency mode E$_2$(high) at 565.5 cm$^{-1}$ and longitudinal optical (LO) phonon mode A$_1$(LO) at 733.1 cm$^{-1}$ were observed, which are attributed to hexagonal GaN.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

REFERENCES

1 Yan, J. et al. AlGaN-based deep-ultraviolet light-emitting diodes grown on High-quality AlN template using MOVPE. *J. Cryst. Growth* 414, 254-257 (2015).
2 Tsai, M. T, et al. The effect of free-standing GaN substrate on carrier localization in ultraviolet InGaN light-emitting diodes. *Nanoscale. Res. Lett.* 9, 675 (2014).
3 Carter, J. C. H. et al. Progress in SiC: from material growth to commercial device development. *Mat. Sci. Eng. B-SOLID* 61-62, 1-8 (1999).
4 Cheng, J. P. et al. High mobility AlGaN/GaN heterostructures grown on Si substrates using a large lattice-mismatch induced stress control technology. *Appl. Phys. Lett* 106, 142106 (2015).
5 Mi, Z., Nguyen, H. P. T., Zhang, S., Cui, K. & Djavid, M. in *Proc. SPIE* 8634, *Quantum Dots and Nanostructures: Synthesis, Characterization, and Modeling X.* (eds K, G, Eyink, D. L. Huffaker, & F. Szmulowicz) 86340B.
6 Guo, W., Zhang, M., Banerjee, A. & Bhattacharya, P. Catalyst-Free InGaN/GaN Nanowire Light Emitting Diodes Grown on (001) Silicon by Molecular Beam Epitaxy. *Nano Lett.* 10, 3355-3359 (2010).
7 Myers, R.; Rajan, S.; Myers, R. C. Device useful for industrial and commercial applications, comprises a nanowire comprising a polar semiconductor material that is compositionally graded along the nanowire. WO2012067687-A2; US2013207075-A1; WO2012067687-A3, WO2012067687-A2 24 May 2012 H01L-029/40 201244.
8 Mi, Z.; Cui, K.; Nguyen, H. P. T.; MI, Z. Semiconductor nanowire device comprises substrate having semiconductor nanowire, where the nanowire has quantum dots within predetermined portion of the nanowire and formed by self-organization of the nanowire during its growth. US2012205613-A1; WO2012106814-A1; EP2673800-

A1; US8669544-B2; JP2014512667-W; CA2864212-A1, US2012205613-A1 16 Aug. 2012 H01L-029/06 201256.
9. Hestroffer, K. et al. In situ study of self-assembled GaN nanowires nucleation on Si(111) by plasma-assisted molecular beam epitaxy. *Appl. Phys. Lett.* 100, 212107 (2012).
10. Arafin, S., Liu, X, H. & Mi, Z, T. Review of recent progress of III-nitride nanowire lasers. *J. Nanophotonics* 7, 074599 (2013).
11. Matthews, J., Hoffmann, E. A., Weber, C., Wacker, A. & Linke, H. Heat flow in InAs/InP heterostructure nanowires. *Phys. Rev. B* 86, 174302 (2012).
12. Jen-Hau, C., Seghete, D., George, S. M., Yang, R. & Lee, Y. C. in *Micro Electro Mechanical Systems (MEMS), 2010 IEEE 23rd International Conference,* 468-471.
13. Feezell, D. F., Speck, J, S., DenBaars, S. P. & Nakamura, S. Semipolar (20(2)over-bar(1)over-bar) InGaN/GaN Light-Emitting Diodes for High-Efficiency Solid-State Lighting. *J. Disp. Technol.* 9, 190-198 (2013).
14. Arik, M., Becker, C. A., Weaver, S. E. & Petroski, J. in *Proc. SPIE* 5187. *Third International Conference on Solid State Lighting,* 64-75 (2014),
15. Schuster, F. et al. Position-Controlled Growth of GaN Nanowires and Nanotubes on Diamond by Molecular Beam Epitaxy. *Nano Lett.* 15, 1773-1779 (2015).
16. Choi, J. H. et al. Nearly single-crystalline GaN light-emitting diodes on amorphous glass substrates. *Nat. Photon.* 5, 763-769 (2011).
17. J. S. Speck and S. J. Rosner, *Physica B.* 1999, 273-4, 24-32
18. J. C. H. Carter, V. F. Tsvetkov, R. C. Glass, D. Henshall, M. Brady, S. G. Müller, O. Kordina, K. Irvine, J. A. Edmond, H. S. Kong, R. Singh, S. T. Allen and J. W. Palmour, *Mater. Sci. Eng., B,* 1999, 61-62, 1-8
19. C. L. Chao, R. Xuan, H. H. Yen, C. H. Chiu, Y. H. Fang, Z. Y. Li, B. C. Chen, C. C. Lin, C. H. Chiu, Y. D. Guo, H. C. Kuo, J. F. Chen and S. J. Cheng, *IEEE Photonics Technol. Lett.,* 2011, 23, 798-800
20. Hanser, Andrew D., Liu, Lianghong, Preble, Edward, Tsvetkov, Denis, Williams, Mark N., Xu, Xueping. GROUP III NITRIDE ARTICLES HAVING NUCLEATION LAYERS, TRANSITIONAL LAYERS, AND BULK LAYERS. United States Patent Application 20150200 2015.
21. Krost, A.; Dadgar, A. Mater. Sci. Eng. B 2002, 93, 77-84.
22. Sarwar, A. T. M. G.; Carnevale, S. D.; Yang. F.; Kent, F.; Jamison, J. J.; McComb, D. W.; Myers, R. C. Small 2015.
23. Wölz, M.; Hauswald, C.; Flissikowski, T.; Gotschke, T.; Fernández-Garrido, S.; Brandt, O.; Grahn, H. T.; Geelhaar, L.; Riechert, H. Nano Lett. 2015, 15, 3743-3747.
24. Brandt, O.; Geelhaar, L.; Woelz, M. Semiconductor device i.e. LED device, for e.g. solar cell, has substrate including continuous pinhole-tree surface layer, titanium nitride and titanium monoxide layer, and nanoscale semiconductor columns arranged on substrate. DE102013009824-A1; WO2014198370-A1, DE102013009824-A1 11 Dec. 2014 H01L-021/203 201501.
25. Akimoto, Katsuhiro, Yamada, Akiyoshi, K A, Kokuhin, Maruyama, Takahiro. Growth method of gallium nitride group semiconductor and substrate for growing the GaN group semiconductor. JPH11224856; H01L21/203; H01L21/205; H01 L33/12; H01L33/16; H01L 33/32; (IPC1-7): H01L21/203; H01L21/205; H01L33/00 17 Aug. 1999.
26. Yamada, A.; Ho, K. P.; Maruyama, T.; Akimoto, K. Appl. Phys. A 1999, 69, 89-92.
27. Yamada, A.; Ho, K. P.; Akaogi, T.; Maruyama, T.; Akimoto, K. J. Crystal Growth 1999, 201-202, 332-335.
28. Jeehwan Kim, Can Bayram, Hongsik Park, Cheng-Wei Cheng, Christos Dimitrakopoulos, John A. Ott, Kathleen B, Reuter, Stephen W. Bedell & Devendra K. Sadana. Nat. Commun. 2014, 5, 4836.
29. Yuan, S.; Kang, X, J.; Wu, D. K.; Kang, X.; Wu, D. Gallium nitride semiconductor device, e.g. LEDS, laser diodes, or lighting for light emission, comprises epitaxial layers having active layer for light generation, n-type layer for light transmission, and p-type layer for light reflection. WO2007037762-A1; SG130975-A1; EP1949458-A1; US2008210969-A1; IN200803638-P1; KR2008070640-A; CN101317278-A; JP2009510765-W; CN101317278-B; U.S. Pat. No. 8,004,001-B2; TW200721553-A; TW413277-B1; SG130975-B, WO2007037762-A1 5 Apr. 2007 200732.
30. Tran, C. A.; Doan, T. T. Fabricating light-emitting diode device involves forming conductive substrate; removing carrier substrate; immersing surface of n-doped layer in electrolytic solution; applying electrical bias; and illuminating surface of the n-doped layer. US2008293171-A1; U.S. Pat. No. 7,629,195-B2, US2008293171-A1 27 Nov. 2008 H01L-021/00 200881.
131. Edwards, P. R.; Martin, R. W.; Kim, H. S.; Kim, K. S.; Cho, Y.; Watson, I. M.; Sands, T.; Cheung, N. W.; Dawson, M. D. Phys. Status Solidi B 2001, 228, 91-94.
32. Tan, B. S.; Yuan, S.; Kang, X. J. Appl. Phys. Lett. 2004, 84, 2757-2759.
33. Lee, H.-Y.; Huang, X.-Y.; Lee, C.-T. J. Electrochem. Soc. 2008, 155, H707-H709.
34. Priti Gupta, A. A. Rahman, Shruti Subramanian, Shalini Gupta, Arumugam Thamizhavel, Tatyana Orlova, Sergei Rouvimov, Suresh Vishwanath, Vladimir Protasenko, Masihhur R. Laskar, Huili Grace Xing, Debdeep Jena, Amab Bhattacharya. arXiv:1509.08256.
35. Lee, S. H.; Kim, S. H.; Song, Y. H.; Jeon, S.-R.; Yu, J. S. Jpn. J. Appl. Phys. 2013, 52, 102102.

Therefore, the following is claimed:

1. A method of growing compound semiconductors on a metal substrate comprising the steps of:
   (i) providing the metal substrate;
   (ii) forming a transition metal dichalcogenide layer on a surface of the metal substrate; and
   (iii) growing a semiconductor epilayer on the transition metal dichalcogenide layer using a semiconductor epitaxy growth system;
   wherein the compound semiconductors are group III-N compound semiconductors selected from the group consisting of: AlN, InN, InGaN, AlGaN, binary relatives thereof, ternary relatives thereof, and quaternary relatives thereof, or group III-V compound semiconductors selected from the group consisting of GaAs, InP, GaSb and their related ternary and quaternary compounds.

2. The method of claim 1, wherein the semiconductor epilayer is formed of nanowires, planar thin film, or both.

3. The method of claim 1, wherein the metal substrate is selected from the group consisting of: thermally and electrically conductive substrates, single crystal metal, and polycrystalline metal.

4. The method of claim 3, wherein the metal substrate includes Mo, Re, Ti, steel, or W.

5. The method of claim 1, wherein the transition metal dichalcogenide layer contains a metal dichalcogenide of the formula $ME_2$, wherein M is a transition metal, and E is a chalcogen.

6. The method of claim 5, wherein the chalcogen is selected from the group consisting of: $WS_2$, $MoS_2$, $WSe_2$, $MoSe_2$, $ReS_2$ and $ReSe_2$ and combinations thereof.

7. The method of claim 1, wherein the metal dichalcogenide layer is a sacrificial layer.

8. The method of claim 1, wherein the metal dichalcogenide layer is formed on the metal substrate using a thin film deposition technique.

9. The method of claim 1, wherein the ternary and quaternary compounds of the group III-V compound semiconductors are selected from the group consisting of AlGaAs, InGaP, InGaAs, and InGaAsP.

10. A structure comprising a compound semiconductor in contact with a layer of metal dichalcogenide, wherein the layer of metal dichalcogenide is in contact with a metal substrate wherein the compound semiconductors are group III-N compound semiconductors selected from the group consisting of: AlN, InN, InGaN, AlGaN, binary relatives thereof, ternary relatives thereof, and quaternary relatives thereof, or group III-V compound semiconductors selected from the group consisting of GaAs, InP, GaSb and their related ternary and quaternary compounds.

11. The structure of claim 10, wherein the compound semiconductor comprises nanowires or planar thin film or both.

12. The structure of claim 10, wherein the compound semiconductor includes SiC or ZnO.

13. The structure of claim 10, wherein the metal substrate is selected from the group consisting of: thermally and electrically conductive substrates, single crystal metal, and polycrystalline metal.

14. The structure of claim 13, wherein the metal substrate includes Mo, Re, Ti, steel, or W.

15. The structure of claim 10, wherein the transition metal dichalcogenide layer contains a metal dichalcogenide of the formula $ME_2$, wherein M is a transition metal, and E is a chalcogen selected from the group consisting of: $WS_2$, $MoS_2$, $WSe_2$, $MoSe_2$, $ReS_2$ and $ReSe_2$.

16. The structure of claim 10, wherein the structure is selected from the group consisting of optoelectronic devices, photonic devices, light emitting diodes (LEDs), laser diodes (LDs), photodiodes, optical modulators, semiconductor optical amplifiers, optical waveguide, photovoltaic or solar cell structures, HEMTs, HBTs, and FETs.

17. The structure of claim 10, wherein the structure is an electronics device selected from the group consisting of: HEMTs, HBTs, and FETs.

18. The structure of claim 10, wherein the ternary and quaternary compounds of the group III-V compound semiconductors are selected from the group consisting of AlGaAs, InGaP, InGaAs, and InGaAsP.

19. A structure comprising a compound semiconductor in contact with a layer of metal dichalcogenide, wherein the layer of metal dichalcogenide is in contact with a metal substrate, wherein the compound semiconductor includes SiC or ZnO.

* * * * *